United States Patent [19]

Kolem et al.

[11] Patent Number: 5,189,370
[45] Date of Patent: Feb. 23, 1993

[54] CHEMICAL SHIFT IMAGING

[75] Inventors: Heinrich Kolem, Effeltrich; Rolf Sauter, Fuerth, both of Fed. Rep. of Germany

[73] Assignee: Siemens Aktiengesellschaft, Berlin and Munich, Fed. Rep. of Germany

[21] Appl. No.: 746,451

[22] Filed: Aug. 16, 1991

[51] Int. Cl.$^5$ ............................................. G01R 33/20
[52] U.S. Cl. ..................................... 324/309; 324/307
[58] Field of Search ............... 324/309, 307, 310, 311, 324/312, 313, 314

[56] References Cited

U.S. PATENT DOCUMENTS

| | | | |
|---|---|---|---|
| 4,470,014 | 9/1984 | Levitt et al. | 324/311 |
| 4,682,106 | 7/1987 | Vatis et al. | 324/307 |
| 4,682,107 | 7/1987 | Bendall et al. | 324/307 |
| 4,922,203 | 5/1990 | Sillerud et al. | 324/309 |
| 4,959,612 | 9/1990 | Luyten | 324/311 |
| 4,984,573 | 1/1991 | Leunbach | 324/309 |

OTHER PUBLICATIONS

"In Vivo Nuclear Overhauser Effect in $^{31}P$-($^1H$) Double-Resonance Experiments in a 1.5T Whole Body MR System", Bachert-Baumann et al., Magnetic Resonance In Medicine 15, pp. 165-172 (1990).
"An Improved Sequence for Broadband Decoupling: WALTZ-16", Shaka et al., Journal of Magnetic Resonance 52, pp. 335-338 (1983).
"Broadband proton decoupling in Human $^{31}P$ NMR Spectroscopy", Luyten et al., NMR in Biomedicine, vol. 1, No. 4, 1989, pp. 177-183.
"Work in Progress: Nuclear Overhauser Enhanced Localized in vivo Phosphorus Spectroscopy Using the CSI Technique", Kolem et al., Poster contributed to 9th Annual Meeting of the Society of Magnetic Resonance in Medicine (SMRM), New York, 1990.

Primary Examiner—Michael J. Tokar
Assistant Examiner—Raymond Y. Mah
Attorney, Agent, or Firm—Lawrence C. Edelman

[57] ABSTRACT

A method for chemical shift imaging is disclosed. A first radio frequency pulse at the resonance frequency of hydrogen and second radio frequency pulse at the resonance frequency of atoms to be examined are applied. Spatial resolution is obtained by phase encoding gradients. The repetition time is shorter than the spin-lattice relaxation time. The first radio frequency pulse at the resonance frequency of hydrogen causes a Nuclear Overhauser Effect enhancement of the resonance line of the atoms to be examined.

5 Claims, 5 Drawing Sheets

RF 1

RF 2

Data Acquisition

Gz

Gx

Gy

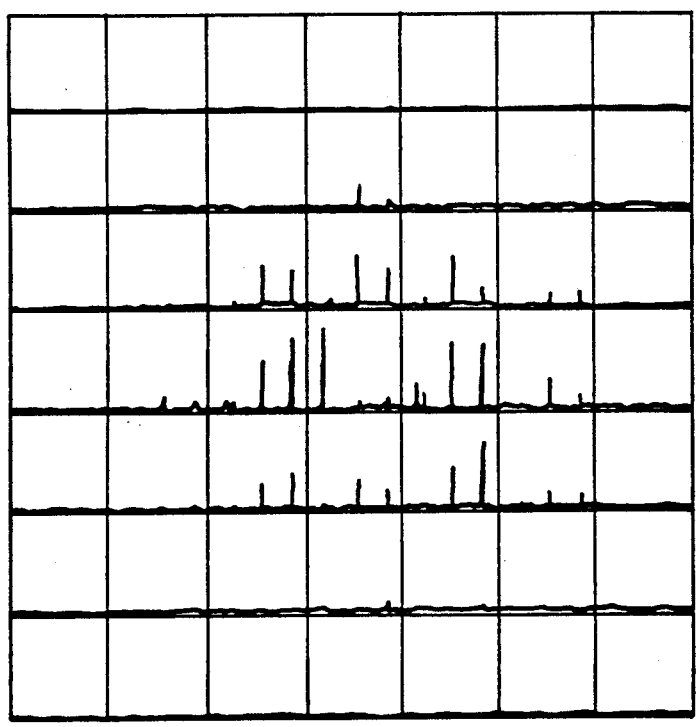
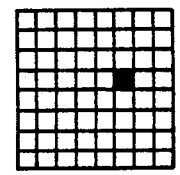
FIG 8a
FIG 8
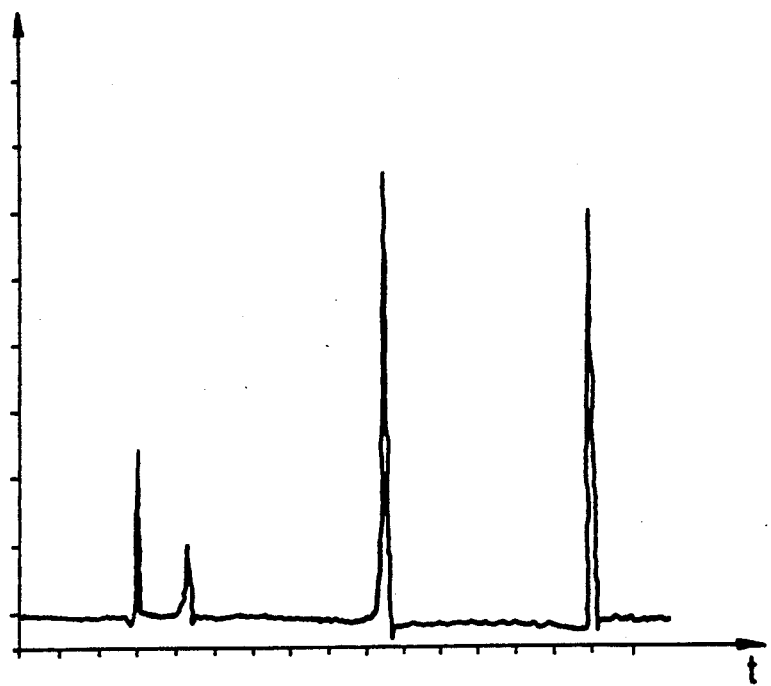
FIG 9

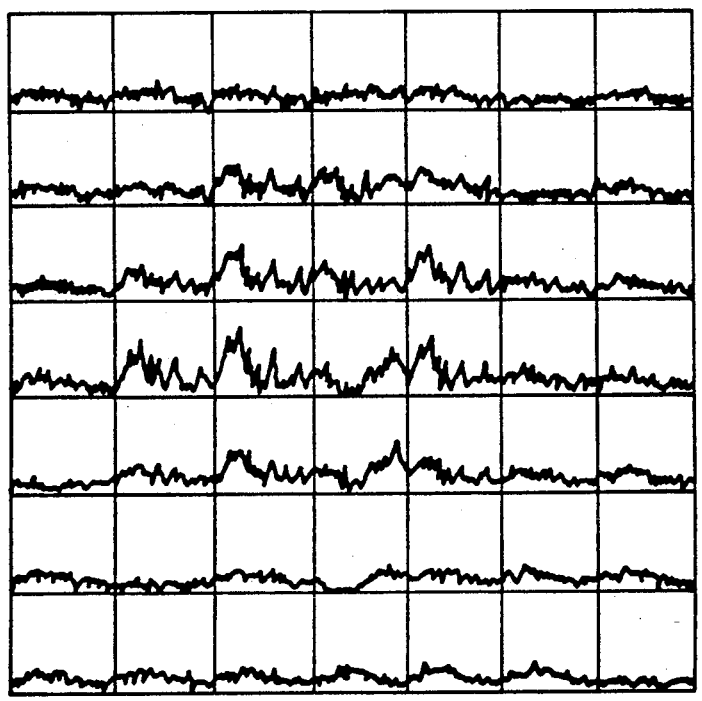
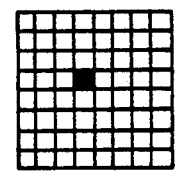
FIG 10a
FIG 10
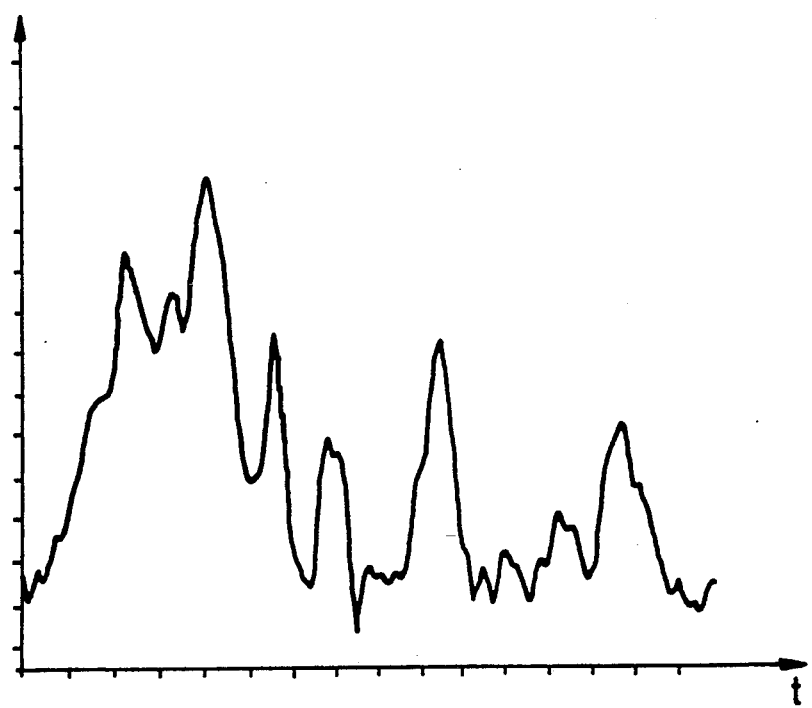
FIG 11

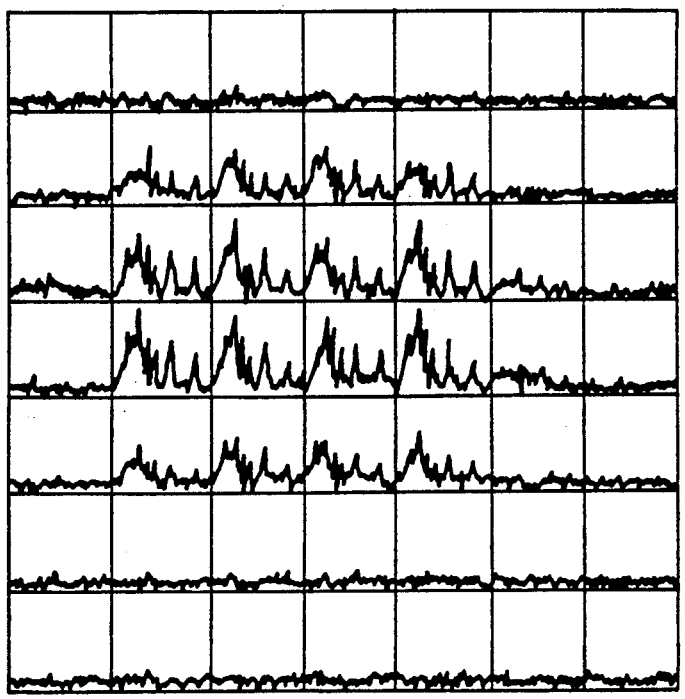
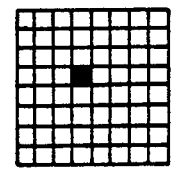
FIG 12a
FIG 12
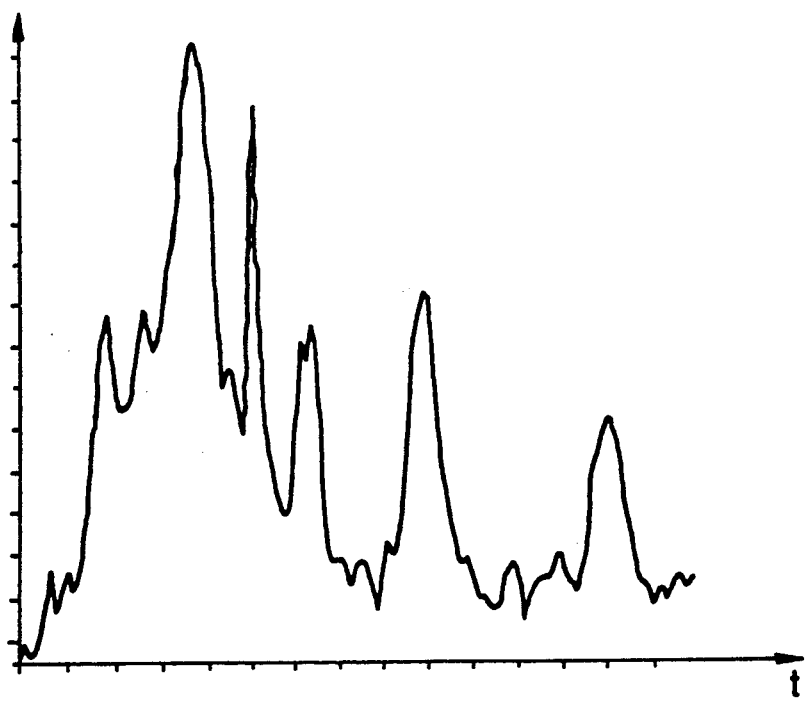
FIG 13

CHEMICAL SHIFT IMAGING

BACKGROUND OF THE INVENTION

The present invention is directed to methods for chemical shift imaging of a subject in a nuclear magnetic resonance imager, wherein the subject is positioned in both a static magnetic field and a varying gradient field and subjected to a sequence of RF pulses for exciting nuclear magnetic resonance in the subject.

Nuclear magnetic resonance devices are known in the art. In such devices, nuclear magnetic resonance (NMR) spectra are obtained from a subject which is positioned in a static magnetic field together with a varying gradient field, and which is subjected to a sequence of RF pulses. The use of the chemical shift imaging (CSI) technique in NMR imaging is also known, and has been described by A. A. Maudsley et al, *Journal of Magnetic Resonance* 51, 147 (1983) and by T. R. Brown et al, *Proceedings of the National Academic Society*, USA, 79, 3523 (1982).

The CSI technique provides both spectral and spatial resolution, and in vivo phosphorus spectroscopy is of specific interest for diagnostic purposes. However, due to the low intrinsic sensitivity of phosphorus spectroscopy the acquisition of localized phosphorus spectra using the CSI technique requires relatively long data acquisition times.

It has been shown (see P. Bachert-Baumann et al in *Magnetic Resonance in Medicine*, 15, pp. 165–172 (1990)) that the phosphorus signal intensity can be increased by saturation of the proton water spins surrounding a phosphorus atom in non-localized phosphorus spectroscopy. As described there, an MR system was equipped with two RF channels — one for the resonance frequency of phosphorus, the other one for the resonance frequency of protons. The so-called WALTZ-8-supercycle as described by A. J Shaka et al in *Journal of Magnetic Resonance* 52, 335 (1983) was used for broad band decoupling of phosphorus and protons. The proton spins were irradiated during the acquisition period of the phosphorus MR signal or during a presaturation phase prior to the phosphorus excitation pulse. Signals enhancements were detected in sequences using decoupling as compared to sequences without decoupling. Signal intensity changes of resonance lines in double resonance experiments were attributed to the Nuclear Overhauser Effect. The magnetization of the proton affects the relaxation mechanism of the phosphorus spin system by bipolar interaction. The enhancement factor depends on the degree to which phosphorus spin relaxation is dominated by bipolar interaction with surrounding protons. The theoretical upper limit of enhancement is 124%.

Broad band proton decoupling in phosphorus NMR spectroscopy using the phase encoding method for spatial resolution has been carried out by P. Luyten et al in NMR in Biomedicine, Vol. 1, No. 5, 1989, pp. 177–183. In the experiments therein described, proton decoupling was achieved by a standard WALTZ-4-sequence. The decoupling sequence was only applied during acquisition of the phosphorus NMR spectrum and was gated off during the recycle delay period. A repetition time of three seconds was used. An improvement in signal-to-noise ratio and spectral resolution was observed in the proton-decoupled phosphorus spectrum.

SUMMMARY OF THE INVENTION

It is an object of the present invention to provide a method for chemical shift imaging which allows reduced acquisition time.

It is further an object of the invention to limit the RF power of the RF pulse sequence to which the subject is exposed.

The above objects are achieved in accordance with the principle of the present invention in a method comprising the following steps performed in order:

applying a first radio frequency pulse at the resonance frequency of hydrogen;

applying a second radio frequency pulse at the resonance frequency of the atoms to be examined;

applying at least one phase encoding gradient;

reading out the FID-signal caused by the second radio frequency pulse;

repeating said applying and reading steps at such a repetition time and such a flip angle of the first radio frequency pulse as will cause a Nuclear Overhauser Effect Enhancement to be achieved while changing the phase encoding gradient from each step to the next step.

The above described method provides localized spectra with short repetition times. Maximum gain in signal-to-noise ratio per unit of measurement time is achieved by inducing the Nuclear Overhauser Effect using single pulse excitation. With this technique the acquisition time can be reduced significantly. The RF power deposition, which is a measure of the power to which the subject is exposed, is far below the international limits for the specific absorption rate.

The excitation can be limited to a selected slice if the second radio frequency pulse is frequency-selective and applied simultaneously with a gradient magnetic field and perpendicular to the direction of each phase encoding gradient.

A two-dimensional spatial resolution within the selected slice can be obtained if two perpendicular phase encoding gradients are applied.

Maximum Nuclear Overhauser enhancement can be obtained by designing the first radio frequency pulse to cause a flip angle of 180° and by making the repetition time of the pulse sequence shorter than the spin-lattice relaxation time.

BRIEF DESCRIPTION OF THE DRAWINGS

FIGS 8 and 8a show a display of a spectral map.

FIG. 9 shows a selected spectrum.

FIGS. 10 and 10a show a display of a spectral map obtained without enhancement by the Nuclear Overhauser Effect.

FIG. 11 shows a corresponding spectrum.

FIGS. 12 and 12a show a display of a spectral map obtained with Nuclear Overhauser Effect enhancement for comparison.

FIG. 13 shows a corresponding spectrum.

DETAILED DESCRIPTION OF PREFERRED EMBODIMENTS

Figure 1:
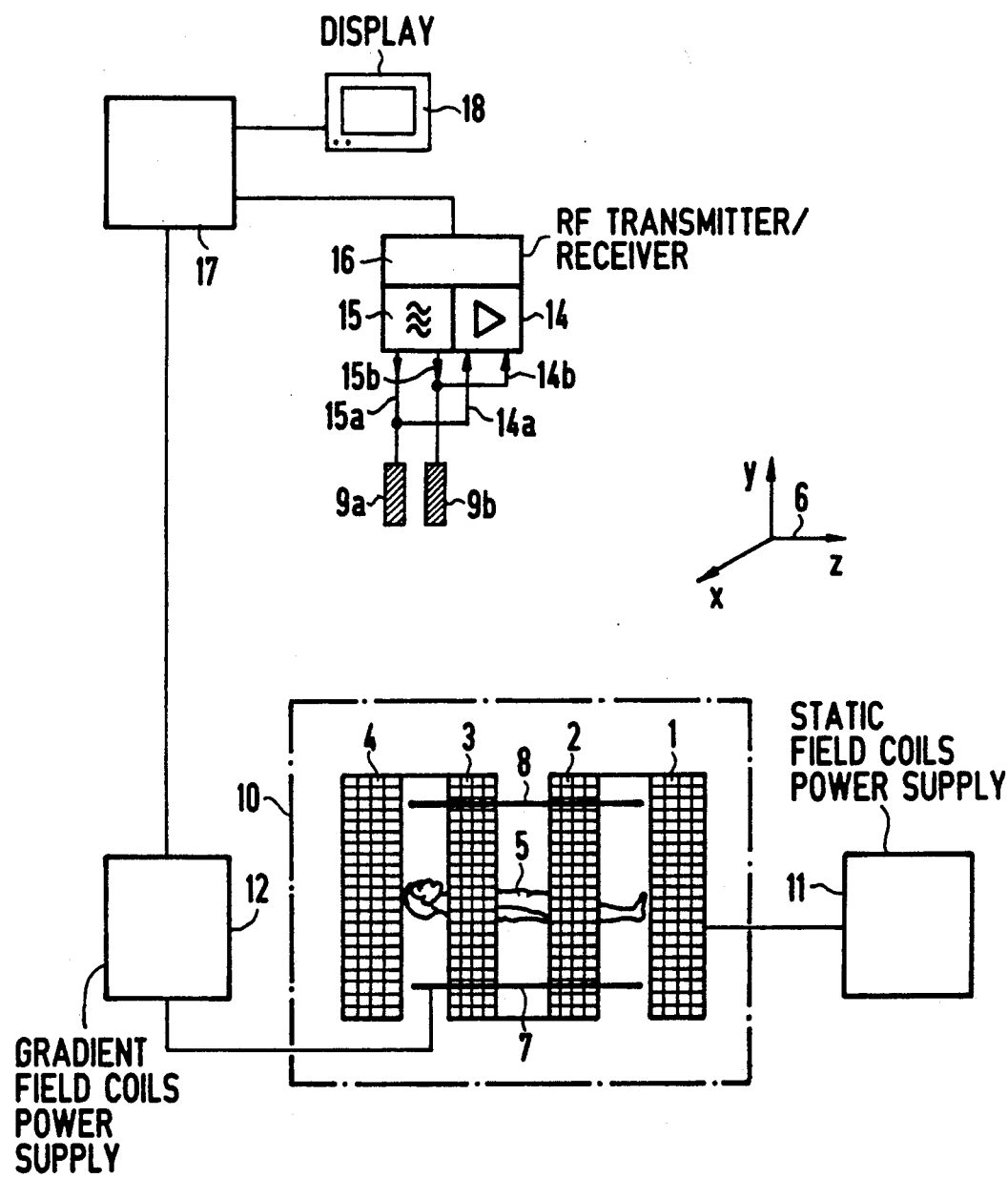
FIG. 1 is schematic diagram showing an NMR imager which can carry out chemical shift imaging in accordance with the invention.

The basic structure of an NMR imager for producing nuclear magnetic spectra from an examination subject is shown in FIG. 1. A static magnetic field in which an examination subject 5 is positioned is generated by coils 1, 2, 3 and 4. The subject 5 is also subjected to gradient magnetic fields which are generated by other coils, such as gradient coils 7 and 8, which generate a magnetic field gradient in the y-direction, in accordance with the axes indicated at 6. Other gradient coils (not shown) are present for generating gradient fields in the z and x directions. The apparatus also includes two surface coils 9a and 9b, one designed for the resonance frequency of phosphorus, the other one for the resonance frequency of protons. In FIG. 1 these surface coils are shown separated from the subject 5. Actually they are located close to the part of the subject 5 to be examined. For example, the surface coils 9a and 9b can be designed as head coils and arranged around the head of a patient for generating the NMR signals.

The coils 1, 2, 3 and 4 are operated by a power supply 11 and coils 7 and 8 (together with the other unshown gradient coils are operated by a power supply 12.

An RF transmitter/receiver 16 includes a transmitter 15 and a signal amplifier 14. The transmitter 15 has two channels for the different frequencies for the surface coils 9a and 9b. The signal amplifier 14 also has two channels 14a and 14b for the two surface coils 9a and 9b. A computer 17 controls the gradient field coil power supply 12 and the RF transmitter/receiver 16. It also generates an output of the spectrum on a display device 18.

In accordance with the preferred embodiment of the invention, the examination subject is subjected to the pulse sequence shown in FIG. 2 through 7. Each sequence starts with the application of an RF pulse RF2 on the proton frequency according to FIG. 3. The RF pulse RF2 is applied without any gradient and therefore is not spatially selective. Advantageously, and in the preferred embodiment, the RF pulse RF2 is designed to cause a flip angle of 180°.

Figure 2:
FIG. 2, FIG. 3, FIG. 4, FIG. 5, FIG. 6 and FIG. 7 show a pulse sequence in accordance with the present invention.
Figure 3:
Figure 4:
Figure 5:
Figure 6:
Figure 7:

A second RF pulse RFI on the phosphorus frequency is applied together with a slice selection gradient Gz according to FIG. 2 and 5. Therefore the excitation of phosphorus is limited to a slice of the object. To compensate for the phase shift caused by the positive lobe of the slice selection gradient Gz a negative lobe of the slice selection gradient Gz is applied in the next step.

Simultaneously with the application of the negative lobe of the slice selection gradient Gz, two phase encoding gradients Gx and Gy are applied. The slice selection gradient Gz and of the phase encoding gradients Gx and Gy are advantageously, and in the preferred embodiment, perpendicular to each other.

In the next step the signal S caused by the excitation of phosphorus is sampled without application of any gradient field. The sampled values are written into a line of a raw data matrix. The sequence described above is repeated in order n × m times with n different values of the gradient integral (amplitude) of the gradient field Gx and m different values of the gradient integral (amplitudes) of the phase encoding gradient Gy.

The pulse sequence described above is repeated at a repetition time which is shorter than the spin-lattice relaxation time. An exemplary repetition time is 300 ms. The Nuclear Overhauser Effect build up occurs on the time scale of the spin lattice relaxation time. If the repetition time of the pulse sequence is short compared with the spin lattice relaxation time, the enhancement will increase from one acquisition to the next, until equilibrium is reached. Maximum Nuclear Overhauser Effect enhancement was achieved by a 180° pulse RF2 and a repetition time of 300 ms. With this pulse sequence the specific absorption rate for a head examination typically was 0.3 W/kg, which is far below applicable regulatory limits.

Because there is a two-dimensional phase encoding caused by the phase encoding gradients Gx and Gy, two-dimensional spatial resolution within the selected slice can be obtained by using a two-dimensional Fourier-transform analysis. This method of obtaining spatial information by phase encoding is described in U.S. Pat. 4,070,611. The data obtained after Fourier-transform are displayed in a spectral map as shown in FIG. 8. In this embodiment spatial resolution is limited to a matrix of 8 ×8 voxels and a phosphorus spectrum is displayed in each voxel. For further analysis a specific voxel can be selected as indicated by the black square in FIG. 8a and displayed separately as shown in FIG. 9. Well-known methods for analyzing spectra can be applied to the selected spectrum.

FIG. 10 to 13 show a comparison of typical results obtained with and without Nuclear Overhauser Effect enhancement. The data shown are based on a 10 minute 2D CSI 31P brain examination with 36 ml spatial resolution. Further experimental conditions were:

8 ×8 matrix
32 acquisitions
repetition time TR 300 ms
field of view 24 ×24 cm$^2$
slice thickness =4cm The data shown in FIG. 10 and 11 were obtained without Nuclear Overhauser Effect enhancement whereas the data shown in FIG. 12 and 13 were obtained with Nuclear Overhauser Effect enhancement based on a sequence as described above. The observed Nuclear Overhauser Effect enhancement is 40% for the PDE resonance.

As shown above the Nuclear Overhauser Effect enhancement can be successfully combined with a chemical shift imaging localization technique in order to provide localized phosphorus spectra within significantly reduced acquisition times. With the proposed technique for Nuclear Overhauser Effect enhancement, the RF power deposition in the subject is far below the international limits for the specific absorption rate.

Although a preferred embodiment has been described above, the scope of the invention is limited only by the following claims:

We claim:

1. A method for chemical shift imaging of atoms other than hydrogen of an examination subject positioned in a static magnetic field comprising the following steps performed in order:
    applying a first radio frequency pulse at the resonance frequency of hydrogen;
    applying a second radio frequency pulse at the resonance frequency of the atoms to be subjected to nuclear magnetic resonance;
    applying at least one phase encoding gradient;
    reading out the FID-signal caused by the second radio frequency pulse;
    repeating said applying and reading steps for a repetition time and for a flip angle of the first radio frequency pulse that will cause an Overhauser Effect enhancement of the resonance line of the atoms subjected to nuclear magnetic resonance to be achieved while changing the phase encoding gradient from each step to the next step.

2. A method according to claim 1, whereby the second radio frequency pulse is frequency-selective and applied simultaneously with a gradient magnetic field perpendicular to the direction of each phase encoding gradient.

3. A method according to claim 1, whereby two perpendicular phase encoding gradients are applied.

4. A method according to claim 1, whereby the first radio frequency pulse is designed to induce a flip angle of 180° in the spins of the atoms which are subjected to nuclear magnetic resonance.

5. A method according to claim 1, whereby the repetition time of said repeating step is shorter than the spin-lattice relaxation time of the atoms which are subjected to nuclear magnetic resonance.

* * * * *